(12) United States Patent
Teng

(10) Patent No.: US 6,245,481 B1
(45) Date of Patent: Jun. 12, 2001

(54) ON-PRESS PROCESS OF LITHOGRAPHIC PLATES HAVING A LASER SENSITIVE MASK LAYER

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

(21) Appl. No.: 09/416,843

(22) Filed: Oct. 12, 1999

(51) Int. Cl.$^7$ ................................................. G03C 1/76
(52) U.S. Cl. ................ 430/270.1; 430/302; 430/303
(58) Field of Search .................... 430/273.1, 270.1, 430/156, 302, 303

(56) References Cited

U.S. PATENT DOCUMENTS

| | | | | |
|---|---|---|---|---|
| 3,962,513 | * | 6/1976 | Eames .................................. | 428/323 |
| 3,997,349 | | 12/1976 | Sanders ................................. | 96/75 |
| 4,020,762 | * | 5/1977 | Peterson et al. .................... | 430/302 |
| 4,030,417 | * | 6/1977 | Lipovac .............................. | 101/451 |
| 4,132,168 | * | 1/1979 | Peterson et al. .................... | 430/296 |
| 4,467,028 | * | 8/1984 | Huang et al. ....................... | 430/302 |
| 4,764,213 | * | 8/1988 | Gventer et al. .......................... | 106/2 |
| 5,219,709 | * | 6/1993 | Nagasaka et al. ................ | 430/281.1 |
| 5,258,263 | | 11/1993 | Cheema et al. ..................... | 430/309 |
| 5,379,698 | * | 1/1995 | Nowak et al. ....................... | 101/454 |
| 5,456,999 | * | 10/1995 | Vaes et al. ........................... | 430/204 |
| 5,506,090 | | 4/1996 | Gardner, Jr. et al. ............... | 430/302 |
| 5,516,620 | | 5/1996 | Cheng et al. ........................ | 430/138 |
| 5,616,449 | | 4/1997 | Cheng et al. ........................ | 430/302 |
| 5,677,110 | | 10/1997 | Chia et al. .......................... | 430/302 |
| 5,858,604 | | 12/1999 | Takeda et al. ...................... | 430/162 |
| 5,874,188 | * | 2/1999 | Roberts et al. ......................... | 430/7 |
| 5,922,502 | | 1/1999 | Damme et al. ..................... | 430/162 |
| 5,948,596 | * | 9/1999 | Zhong et al. ..................... | 430/278.1 |
| 6,030,750 | * | 2/2000 | Vermeersch et al. ............... | 430/302 |
| 6,031,024 | * | 2/2000 | Uraki et al. ......................... | 523/161 |
| 6,060,217 | * | 5/2000 | Nguyen et al. ..................... | 430/302 |
| 6,080,523 | * | 6/2000 | Vermeersh et al. ............... | 430/270.1 |
| 6,132,933 | * | 10/2000 | Nguyen .............................. | 430/272.1 |

OTHER PUBLICATIONS

Le, Hue P. "Progress and Trends in Ink–jet Printing Technology." Journal of Imaging Science and Technology Jan./Feb. 1998: 49–62.*

* cited by examiner

*Primary Examiner*—Janet Baxter
*Assistant Examiner*—Barbara Gilmore

(57) ABSTRACT

This patent describes on-press process of a lithographic plate comprising on a substrate a photosensitive layer and a top laser sensitive mask layer. The plate is exposed by first digitally exposing the plate with an infrared radiation to selectively remove or render transparent to an actinic radiation exposed areas of the mask layer and then overall exposing the plate with the actinic radiation to cause hardening or solubilization of the photosensitive layer in the infrared laser exposed areas. The exposed plate is processed on a printing press by contacting the plate with ink and/or fountain solution during initial press operation to remove the mask layer and develop the photosensitive layer. Optionally, an ink and/or fountain solution soluble or dispersible interlayer may be interposed between the mask layer and the photosensitive layer.

30 Claims, No Drawings

ON-PRESS PROCESS OF LITHOGRAPHIC PLATES HAVING A LASER SENSITIVE MASK LAYER

FIELD OF THE INVENTION

This invention relates to lithographic printing plates. More particularly, it relates on-press process of lithographic plates comprising on a substrate a photosensitive layer and a top laser sensitive mask layer.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. No. 5,258,263 (Cheema, et al), U.S. Pat. No. 5,516,620 (Cheng, et al), U.S. Pat. No. 5,561,029 (Fitzgerald, et al), U.S. Pat. No. 5,616,449 (Cheng, et al), U.S. Pat. No. 5,677,110 (Chia, et al), and U.S. Pat. No. 5,811,220 (Cheng, et al). Most of these patents are aimed to address the inherent problems which often encounter on-press developable plates, such as poor developability, tackiness, poor durability, and poor shelf-life stability.

Conventionally, the plate is exposed with an actinic light (usually an ultraviolet light from a lamp) through a separate photomask film having predetermined image pattern which is placed between the light source and the plate. While capable of providing plate with superior lithographic quality, such a method is cumbersome and labor intensive.

Laser sources have been increasingly used to imagewise expose a printing plate which is sensitized to a corresponding laser wavelength. This would allow the elimination of the photomask film, reducing material, equipment and labor cost.

U.S. Pat. No. 4,132,168 (Peterson) discloses a lithographic plate consisting of on a substrate an ultraviolet light (UV) sensitive layer and a top mask layer which is opaque to UV light and is capable of being removed or rendered transparent to UV light by a non-actinic laser radiation. While this plate is capable of digital imaging, it requires two cumbersome chemical processes after exposure, namely a mask layer removal process and a development process.

U.S. Pat. No. 5,858,604 (Takeda, et al) discloses a lithographic plate having on a substrate a photosensitive layer containing an o-quinonediazide or diazo compound, and a water or aqueous alkaline soluble laser sensitive mask layer. While this plate is capable of digital imaging and one-step process, a cumbersome, liquid waste-generating wet process using a liquid developer is required.

U.S. Pat. No. 5,922,502 (Damme, et al) discloses a lithographic plate having on the substrate a photosensitive layer, an aqueous medium soluble or swellable interlayer, and an infrared laser sensitive mask layer. The introduction of the interlayer allows simultaneous removal of the mask layer and development of the photosensitive layer, as well as the removal of the interlayer. However, the removal of the mask layer in large non-imaging areas is difficult, since the mask layer is not soluble or dispersible in the developer and it is hard for the developer to reach these areas of interlayer which are fully covered by the mask layer.

Despite the progress in conventional on-press developable plates and digital laser imagable plates, there is still a desire for a laser imagable plate which can be processed on-press with ink and/or fountain solution, has excellent press performance, and can be manufactured conveniently and inexpensively.

SUMMARY OF THE INVENTION

It is an object of this invention to provide a laser imagable lithographic plate which is on-press processable with ink and/or fountain solution and gives excellent press performance.

It is another object of this invention to provide a method of on-press process of a laser imagable lithographic plate comprising on a substrate a photosensitive layer and an infrared laser sensitive mask layer.

Further objects, features and advantages of the present invention will become apparent from the detailed description of the preferred embodiments.

According to the present invention, there has been provided a method of lithographically printing images on a receiving medium, comprising in order:

(a) providing a lithographic plate comprising (i) a substrate; (ii) a photosensitive layer capable of hardening (negative-working) or solubilization (positive-working) upon exposure to an actinic radiation in ultraviolet and visible region, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an abhesive fluid for ink; and (iii) an infrared laser sensitive mask layer which is substantially opaque to the actinic radiation and is soluble or dispersible in ink (for waterless plate) or in ink and/or fountain solution (for wet plate), and is capable of being removed or rendered transparent to the actinic radiation upon exposure to an infrared laser radiation;

(b) imagewise exposing the plate with the infrared laser radiation to selectively remove or render transparent to the actinic radiation exposed areas of the mask layer;

(c) overall exposing the plate with the actinic radiation to cause hardening or solubilization of the photosensitive layer in the areas wherein the mask layer has been removed or rendered transparent by the infrared laser radiation; and (d) contacting said exposed plate with ink (for waterless plate), or with ink and/or fountain solution (for wet plate) to remove the mask layer and develop the photosensitive layer, and to lithographically print images from said plate to the receiving medium.

According to another aspect of the present invention, there has been provided a lithographic printing plate, comprising in order: (i) a substrate; (ii) a photosensitive layer capable of hardening (negative-working) or solubilization (positive-working) upon exposure to an actinic radiation in ultraviolet and visible region, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an abhesive fluid for ink; and (iii) an infrared laser sensitive mask layer which is substantially opaque to the actinic radiation and is soluble or dispersible in ink (for waterless plate) or in ink and/or fountain solution (for wet plate), and is capable of being removed or rendered transparent to the actinic radiation upon exposure to an infrared laser radiation.

An ink and/or fountain solution soluble or dispersible interlayer may be inserted between the photosensitive layer and the mask layer to, for example, reduce adverse effects of laser heat on the photosensitive layer.

DETAILED DESCRIPTION OF THE PREFERRED EMBODIMENTS

Plate Construction

The lithographic plate of this invention comprises a substrate, a photosensitive layer, and a mask layer. The photosensitive layer is capable of hardening (negative-working) or solubilization (positive-working) upon exposure to an actinic radiation, and the non-hardened or solubilized areas of said photosensitive layer is soluble or dispersible in ink (for waterless plate) or in ink and/or fountain solution (for wet plate). The mask layer is substantially opaque to the actinic radiation and is soluble or dispersible in ink (for waterless plate) or in ink and/or fountain solution (for wet plate), and is capable of being removed or rendered transparent to the actinic radiation upon exposure to an infrared laser radiation. Such a plate requires both stripping of the mask layer and development of the photosensitive layer during on-process process.

This lithographic plate can be exposed by first digitally exposing the plate with infrared radiation to selectively remove or render transparent to an actinic radiation (in ultraviolet and visible region) exposed areas of the mask layer and then overall exposing the plate with the actinic radiation to cause hardening or solubilization of the photosensitive layer in the infrared laser exposed areas. The exposed plate can be processed on a printing press during initial press operation by contacting the plate with ink (for waterless plate), or with ink and/or fountain solution (for wet plate) to remove the mask layer and develop the photosensitive layer. No regular developer is needed in such a process. After the plate being on-press processed, the press can continue to operate to print out regular printed sheets.

The photosensitive layer should exhibit an affinity or aversion substantially opposite to the affinity or aversion of the substrate to at least one printing liquid selected from the group consisting of ink and an abhesive fluid for ink. For example, a wet plate can have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An abhesive fluid for ink is a fluid which repels ink. Fountain solution is the most commonly used abhesive fluid for ink. A wet plate is printed on a wet press equipped with both ink and fountain solution, while a waterless plate is printed on a waterless press equipped with ink.

For on-press developable waterless lithographic plates, both the mask layer and the photosensitive layer are soluble or dispersible in ink.

For on-press developable wet lithographic plates, both the mask layer and the photosensitive layer can be soluble or dispersible in ink, fountain solution, or an emulsion of ink and fountain solution. However, the mask layer and the photosensitive layer can be soluble or dispersible in different press liquids selected from the group consisting of ink, fountain solution, and an emulsion of ink and fountain solution. For example, the mask layer can be fountain solution soluble or dispersible, and the photosensitive layer can be ink soluble or dispersible; or vise versa. During initial press operation, the fountain solution and ink (and the emulsion formed thereof) are capable of developing both the fountain solution soluble or dispersible layer (e.g., the mask layer) and the ink soluble or dispersible layer (e.g., the photosensitive layer). Therefore, on-press process of a wet plate (on a wet press) is unique in that two layers with opposite solubility or dispersibility (water soluble or dispersible vs. ink soluble or dispersible) can be developed simultaneously with ink and fountain solution.

For plates with rough and/or porous surface capable of mechanical interlocking with a coating deposited thereon, a thin releasable sublayer soluble or dispersible ink (for waterless plate) or ink and/or fountain solution (for wet plate) may be deposited between the substrate and the photosensitive layer. Here the substrate surface is rough and/or porous enough and the interlayer is thin enough to &llow bonding between the photosensitive layer and the substrate through mechanical interlocking. Such a plate configuration is described in U.S. patent application Ser. No. 09/036,881 (in which such a sublayer is called interlayer), the entire disclosure of which is hereby incorporated by reference.

A very thin transparent top layer (capable of being ablated off when coated on a laser ablative mask layer), which is soluble or dispersible in ink (for waterless plate) or in ink and/or fountain solution (for wet plate), can be deposited atop the mask layer to, for example, protect the mask layer from physical or chemical damage or to prevent the press operator from direct contact with the mask layer during handling. Examples of materials suitable for this top layer include ink soluble or dispersible polymers, and water soluble or dispersible polymers. Various additives can be added in the top layer to enhance, for example, the surface properties of the plate. Such additives include, for example, surfactant and particulate dispersion. This top layer preferably has a thickness of less than 2 micrometer, and more preferably from 0.1 to 0.5 micrometer.

Laser Sensitive Mask Layer

For forming an infrared laser sensitive mask layer, any materials are suitable, which are opaque to actinic light, capable of being removed or rendered transparent to actinic light upon infrared laser exposure, and soluble or dispersible in ink (for waterless plate) or in ink and/or fountain solution (for wet plate). Examples of such materials include a coating of metal, carbon black, or infrared dye (which generally also absorbs strongly in the ultraviolet region) dispersed or dissolved in a polymeric binder that is soluble or dispersible in ink and/or fountain solution. It would be preferred that such a coating can be deposited from a solution or dispersion which does not substantially dissolve or penetrate the photosensitive layer (or the interlayer) so that an inexpensive conventional coating process can be used. The depositing solution or dispersion may be an aqueous or solvent solution or dispersion. A solvent, aqueous alkaline or water soluble or dispersible binder may be used. A preferred aqueous dispersion capable of forming an ink soluble or dispersible mask layer comprises a polymeric emulsion and an aqueous soluble or dispersible infrared light absorbing material. A preferred aqueous dispersion or solution capable of forming a fountain solution soluble or dispersible mask layer comprises a water soluble polymer and an aqueous soluble or dispersible infrared light absorbing material; examples of such a solution or dispersion are described in U.S. Pat. No. 5,858,604. A preferred solvent solution capable of forming an ink soluble or dispersible mask layer comprises an ink soluble or dispersible polymer and an infrared absorbing material.

Various additives may be added in the mask layer to enhance certain properties of the plate. Such additives include surfactant, dispersing agent, infrared light absorbing dye or pigment, ultraviolet light absorbing dye or pigment, plasticizer, compounds capable of enhancing thermal ablation of the mask layer, and compounds capable of enhancing the solubility or dispersibility of the mask layer in ink and/or fountain solution. Usually a single pigment or dye (such as a metal, carbon black or a certain infrared dye) can function as infrared absorber as well as actinic (usually ultraviolet) light absorber. For example, carbon black is a pigment which absorbs in both the infrared region and the ultraviolet region (as well as the visible region); most infrared dye also absorbs in the ultraviolet region. However, combination of an infrared light absorbing pigment or dye and an actinic light absorbing pigment or dye can also be used in the mask layer. The mask layer may contain one or more infrared light absorbing dye or pigment. Likewise, the mask layer may contain one or more ultraviolet light absorbing dye or pigment.

The mask layer is usually deposited onto the photosensitive layer from a solution or dispersion which does not substantially dissolve or penetrate the photosensitive layer (or the interlayer, for plate with interlayer). However, the mask layer may be laminated onto the photosensitive layer from a preformed thin film which is soluble or dispersible in ink and/or fountain solution. Such a process is particularly important when a suitable depositing solution or dispersion for the mask layer can not be found. An ink and/or fountain solution soluble or dispersible adhesion layer may be coated on the mask layer-forming thin film to provide adhesion to the photosensitive layer. Heat and/or pressure may be used to help adhere the mask layer to the photosensitive layer.

The thickness of the mask layer is preferably chosen so that sufficient opaqueness to the actinic light is obtained while maintaining suitable infrared laser sensitivity. Preferably, 90% or more of the actinic light is absorbed by the mask layer, more preferably 99%, and most preferably 99.9%. For laser ablatable mask layer, the mask layer should be thick enough to have sufficient opaqueness and at the mean time thin enough so that the mask layer can be removed efficiently in the areas exposed with laser at a practical dosage. The mask layer preferably has a thickness of from 0.1 to 4 micrometer, and more preferably from 0.3 to 1.5 micrometer.

Interlayer

Optionally, an interlayer can be interposed between the mask layer and the photosensitive layer to reduce, for example, adverse effects of laser heat on the photosensitive layer. The interlayer should be soluble or dispersible in ink (for waterless plate) or in ink and/or fountain solution (for wet plate), and substantially transparent to the actinic light. The interlayer may consist of any material with the desired properties. Polymers are the preferred materials. A solvent, aqueous alkaline or water soluble or dispersible binder may be used. A solvent soluble polymer dispersed in water (such as latex) may be used to form an ink soluble or dispersible interlayer. The interlayer may be deposited onto the photosensitive layer through any means. However, it would be preferred that the interlayer can be deposited from a solution or dispersion which does not substantially dissolve or penetrate the photosensitive layer so that an inexpensive conventional coating process can be used. Various additives may be added in the interlayer to enhance certain properties of the plate. Such additives include surfactant, dispersing agent, dye, and pigmnent. While the interlayer is not sensitive to infrared light, an infrared light absorber may be added to, for example, prevent the infrared radiation from reaching the photosensitive layer. The interlayer preferably has a thickness of from 0.1 to 4 micrometer, and more preferably from 0.5 to 2 micrometer.

Photosensitive Layer

For preparing printing plates of the current invention, any photosensitive layer is suitable which is capable of hardening or solubilization upon exposure to an actinic radiation in ultraviolet and visible region (about 150 to about 650 nm in wavelength), and is soluble or dispersible in ink (for waterless plate) or in ink and/or fountain solution (for wet plate) in the non-hardened or solubilized areas. Here hardening means becoming insoluble and non-dispersible in ink and/or fountain solution (negative-working), and solubilization means becoming soluble or dispersible in ink and/or fountain solution (positive-working). The photosensitive layer preferably has a coverage of from 100 to 6000 mg/m$^2$, and more preferably from 500 to 3000 mg/m$^2$.

Photosensitive layer suitable for the current invention may be formulated from various photosensitive materials. The components ratios (such as monomer to polymer ratio) are usually different from conventional plates designed for development with a regular liquid developer. Various additives may be added to, for example, enhance on-press developability. Such additives include surfactant, plasticizer, water soluble polymer or compound, and ink soluble polymer or compound. Various additives useful for conventional photosensitive layer can also be used. These additives include pigment, dye, exposure indicator, and stabilizer.

Photosensitive materials useful in negative-working wet plates of this invention include, for example, photopolymers (comprising acrylic monomers, polymeric binders, and photoinitiators), light-sensitive compositions comprising polyfunctional vinyl ethers or epoxy monomers and cationic photoinitiators, and polycondensation products of diazonium salts.

Photosensitive materials useful in positive-working wet plates of this invention include, for example, diazo-oxide compounds such as benzoquinone diazides and naphthoquinone diazides.

Photosensitive oleophobic materials useful in waterless plates of this invention include, for example, compositions comprising polymers having perfluoroalkyl groups and crosslinkable terminal groups, and compositions comprising polysiloxane and crosslinkable resins.

In a preferred embodiment as for negative-working wet lithographic printing plates of this invention, the photosensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one photosensitive free-radical initiator (including sensitizer), and other additives such as surfactant, dye or pigment, exposure-indicating dye (such as leuco crystal violet, azobenzene, 4-phenylazodiphenylamine, and methylene blue dyes), and free-radical stabilizer (such as methoxyhydroquinone). Suitable polymeric binders include polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehye, and butadiene/acrylonitrile copolymer. Suitable free-radical polymerizable monomers (including oligomers) include multifunctional acrylate monomers or oligomers (such as acrylate and methacrylate esters of ethylene glycol, trimethylolpropane, pentaerythritol, ethoxylated ethylene glycol and ethoxylated trimethylolpropane, multifunctional urethanated acrylate and methacrylate, and epoxylated acrylate or methacrylate), and oligomeric amine diacrylates. Suitable photosensitive free-radical initiators include the derivatives of acetophenone (such as 2,2-dimethoxy-2-phenylacetophenone, and 2-methyl-1-[4-(methylthio)phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, s-triazine, and titanocene (bis($\eta^9$-2,4-cyclopentadien-1-yl), bis[2,6-difluoro-3-(1H-pyrrol-1-yl)phenyl) titanium).

In a second preferred embodiment as for negative-working wet lithographic printing plates of this invention, the photosensitive layer comprises a polycondensation product of diazonium salt (diazo resin), with or without a polymeric binder, and other additives such as colorants, stabilizers, exposure indicators, surfactants and the like. Particularly useful diazo resins include, for example, the condensation product of p-diazodiphenylamine and formaldehyde, and the condensation product of 3-methoxy-4-diazodiphenylamine and formaldehyde. Particularly useful polymeric binders for use with such diazo resins include, for examples, acrylic polymers, vinyl polymers, and polyvinyl alcohol. Examples of water developable photosensitive layer based on diazo resins and polymers are described in U.S. Pat. No. 5,922,502.

In another preferred embodiment as for negative-working wet lithographic printing plates of this invention, the photosensitive layer comprises at least one polyfunctional vinyl ether or epoxy monomer (or oligomer), at least one cationic photoinitiator (including sensitizer), optionally one or more polymeric binders, and other additives such as colorants, stabilizers, exposure indicators, surfactants and the like. Examples of useful polyfinctional epoxy monomers are 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin. Examples of useful cationic photoinitiators are triarylsulfonium hexafluoroantimonate and triarylsulfonium hexafluorophosphate. Examples of useful polymeric binders are polybutylmethacrylate, polymethylmethacrylate and cellulose acetate butyrate.

Substrate

The substrate employed in the lithographic plates of this invention can be any lithographic support. Such a substrate may be a metal sheet, a polymer film, or a coated paper. Aluminum (including aluminum alloys) sheet is a preferred metal support. Particularly preferred is an aluminum support which has been grained, anodized, and deposited with a barrier layer. Polyester film is a preferred polymeric film support. A surface coating may be coated to achieve desired surface properties. For wet plate, the substrate should have a hydrophilic or oleophilic surface, depending on the surface properties of the photosensitive layer; commonly, a wet lithographic plate has a hydrophilic substrate and an oleophilic photosensitive layer. For waterless plate, the substrate should have an oleophilic or oleophobic surface, depending on the surface properties of the photosensitive layer.

Particularly preferred hydrophilic substrate for a wet lithographic plate is an aluminum support which has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer which is crosslinked, as described in U.S. Pat. No. 5,922,502.

Exposures

It is noted that the term actinic light or actinic radiation in this patent refers to radiation which can cause hardening or solubilization of the photosensitive layer. The actinic radiation in this patent should be in the region from ultraviolet light to visible light (about 150 to about 650 nm in wavelength). Ultraviolet light is a preferred actinic radiation.

Infrared laser useful for imagewise exposure for the mask layer include laser sources emitting in the infrared region, i.e. emitting in the wavelength range of above 700 nm, preferably 700–1500 nm. Particularly preferred infrared laser sources are laser diodes emitting around 830 nm or aNdYAG laser emitting around 1060 nm.

Infrared laser imaging devices are currently widely available commercially. Any device can be used which provides imagewise infrared laser exposure according to digital image information. Commonly used imaging devices include flatbed imager, internal drum imager, and external drum imager. Internal drum imager and external drum imager are preferred imaging devices.

After imagewise laser exposure, the plate is subjected to an actinic light overall exposure. The actinic light can be an ultraviolet light or visible light. Examples of actinic light sources include a high pressure mercury lamp, a xenon lamp, and a fluorescence lamp. The plate can be exposed with an actinic light in a regular plate exposure device with or without the plate being under vacuum, or can be directly exposed on the same imaging device for the infrared laser exposure with the plate being on the drum or the flatbed. The actinic light may irradiate the plate during the imagewise laser exposure (An actinic light source may be fixed next to the infrared laser.), or may irradiate the plate only after the imagewise laser exposure is completed. The plate may also be exposed on a printing press cylinder (for both laser imaging and overall actinic radiation), and the exposed plate can be directly processed on press with ink and/or fountain solution and then print out regular printed sheets. For direct exposure in an imaging device for a plate having free radical crosslinkable photosensitive layer, an inert gas (such as nitrogen) may be introduced within the device to reduce inhibition of free radical polymerization of the photosensitive layer by oxygen.

On-Press Process

The imagewise and overall exposed plate is subjected to on-press process with ink (for waterless plate) or with ink and/or fountain solution (for wet plate). The plate is mounted on the press cylinder as for a conventional plate to be printed. The press is then started to contact the plate with ink (for waterless plate) or with ink and/or fountain solution (for wet plate) to remove the mask layer and develop the photosensitive layer, and to lithographically print images from said plate to the receiving medium. Good quality prints should be obtained preferably under 20 initial impressions, more preferably under 10 impressions, most preferably under 5 impressions. It is noted that the receiving medium can be any object onto which images can be printed lithographically. Commonly, the receiving medium is sheet-like material or web-like material, such as paper, plastic film, or metal foil. Sheet-like materials (such as paper sheets) are suitable for printing on a sheet-fed press, and web-like materials (such as a roll of paper) are suitable for printing on a web-fed press.

For wet press, usually fountain solution is applied (to contact the plate) first, followed by contacting with ink roller. However, ink roller may be applied first, or both ink roller and fountain solution can be applied the same time. This depends on the properties of plate.

It is noted that the mask layer may be stripped off before the photosensitive layer is developed, or the mask layer may be stripped off at the same time as the photosensitive layer is developed. However, both layers should be stripped off or developed preferably within 20 initial impressions.

This invention is further illustrated by the following examples of its practice. Unless specified, all the values are by weight.

EXAMPLE 1

This example demonstrates a lithographic plate comprising on a substrate an ink soluble or dispersible photosensitive layer, and a fountain solution soluble or dispersible mask layer which is deposited from an aqueous solution. The plate can be processed (stripped and developed) on press with ink and fountain solution.

An aluminum sheet which had been AC electrochemically roughened, anodized, and thermally treated with polyvinyl phosphonic acid aqueous solution was used as the plate substrate. The aluminum substrate was coated using a #6 Meyer rod with a photosensitive layer formulation PS-1 to achieve a dry coverage of about 1.1 g/m$^2$, followed by drying in an oven at 70° C. for 5 min.

| Formulation PS-1 | Weight (g) |
|---|---|
| Neocryl B-728 polymer (from Zeneca) | 12.02 |
| Ebecryl RX8301 oligomer (from UCB Chemicals) | 3.21 |
| Sartomer SR-399 monomer (from Sartomer) | 20.04 |
| Irgacure 907 initiator (from Ciba-Geigy) | 1.60 |
| Isopropyl thioxanthone (Sensitizer) | 0.80 |
| Methoxyether hydroquinone (Antioxidant) | 0.04 |
| Irganox 1035 antioxidant (from Ciba Geigy) | 0.04 |
| Orasol Blue GN dye (from Ciba Geigy) | 0.32 |
| Leuco crystal violet (Exposure indicator) | 0.32 |
| Pluronic L43 surfactant (from BASF) | 1.60 |
| Cyclohexanone | 40.0 |
| Methylethylketone | 320.0 |

The photosensitive layer coated plate was further coated with a mask layer formulation ML-1 using a #5 Meyer rod to achieve a dry coverage of about 0.6 g/m$^2$, followed by drying in an oven at 70 ° C. for 8 min.

| Formulation ML-1 | Weight ratios |
|---|---|
| UNIPERSE BLACK C-E2N | 6.25 |
| (45% wt., aqueous carbon black dispersion from Ciba-Geigy) | |
| IR-125 (infrared dye from Eastman Kodak) | 0.94 |
| Glycerol | 1.25 |
| Airvol 603 (polyvinyl alcohol from Air Products and Chemicals Co.) | 1.25 |
| FC120 (25% wt., surfactant from 3M) | 0.06 |
| Water | 90.25 |

The above plate was exposed with an infrared laser plate imager equipped with laser diodes (8-channels, about 500 mW each) emitting at 830 nm with a laser size of about 15 micrometer (ThermalSetter™, from Optronics International). The plate was placed on the imaging drum (external drum with a circumference of 1 meter) and secured with vacuum (and master tape if necessary). The exposure dosage was controlled by the drum speed. The plate was exposed at a laser dosage (about 300–500 mJ/cm$^2$) sufficient to substantially remove the mask layer in the exposed areas by ablation. The laser imaged plate was overall exposed to a UV light with an emission peak of about 364 nm for 2 min.

The exposed plate was tested on a Hamada 602 CD duplicate wet lithographic printing press equipped with both ink (Van Son Rubber Base Plus BS151 Black #10850, by Holland Ink Corporation, Holland) and fountain solution (Superlene All Purpose Fountain Solution Concentrate from Varn, Oakland, N.J., diluted with 5 times of water). The exposed plate was mounted on the press, damped with fountain solution for 10 sec., rolled up with ink for 10 sec., and then printed to the blanket and receiving papers. Under 10 impressions, the plate was completely developed, and good prints were obtained. The press continued to run for a total of 5,000 impressions without showing any wearing.

A similar plate was subjected to hand test for on-press process capability. The plate was rubbed 10 times with a cloth soaked with both fountain solution (prepared from Superlene Brand All Purpose Fountain Solution Concentrate made by Varn, Oakland, N.J.) and ink (Sprinks 700 Acrylic Black ink from Sprinks Ink, Fla.) to check on-press processing and inking; additional 200 rubs were performed to check the durability of the plate. The plate developed completely under 6 double rubs, with the mask layer and the non-imaging areas of the photosensitive layer being completely removed. Here a double rub is defined as a back-and-forth rub. The processed plate showed good imaging pattern, clean background, and good durability (no wearing off at 200 rubs).

EXAMPLE 2

In this example, the photosensitive layer was the same as in EXAMPLE 1 except that the substrate used in EXAMPLE 1 was further coated with a thin releasable sublayer (a water-soluble polymer) before coating the photosensitive layer.

An AC electrochemically grained, anodized, and polyvinyl phosphonic acid treated aluminum substrate was first coated with a 0.2% aqueous solution of polyvinyl alcohol (Airvol 540, from Air Products and Chemicals) with a #6 Meyer rod to achieve a dry coverage of about 0.02 g/m$^2$, followed by drying in an oven at 70 °C. for 8 min. The polyvinyl alcohol coated substrate was further coated with the photosensitive layer formulation PS-1 with a #6 Meyer rod to achieve a dry coating coverage of about 1.1 g/m$^2$, followed by drying in an oven at 70 °C. for 5 min. The photosensitive layer coated plate was further coated with a mask layer formulation ML-1 using a #5 Meyer rod to achieve a dry coverage of about 0.6 g/m$^2$, followed by drying in an oven at 70 °C. for 8 min.

The plate was exposed and hand processed as in EXAMPLE 1. The plate developed completely under 4 double rubs, with the mask layer and the non-imaging areas of the photosensitive layer being completely removed. The processed plate showed good imaging pattern, clean background, and good durability.

EXAMPLE 3

This example demonstrates a lithographic plate comprising on a substrate an ink soluble or dispersible photosensitive layer, an ink soluble or dispersible interlayer which is deposited from an aqueous polymeric emulsion (and is not soluble or dispersible in water after drying), and a fountain solution soluble or dispersible mask layer which is deposited from an aqueous dispersion. The plate can be processed on press with ink and fountain solution.

An mechanically grained, anodized, and polyvinyl phosphonic acid treated aluminum substrate was used as the plate substrate. The aluminum substrate was coated using a #6 Meyer rod with a photosensitive layer formulation PS-2 to achieve a dry coverage of about 1.1 g/m$^2$, followed by drying in an oven at 70 °C. for 5 min.

| Formulation PS-2 | Weight (g) |
| --- | --- |
| Neocryl B-728 polymer (from Zeneca) | 12.0 |
| Ebecryl RX8301 oligomer (from UCB Chemicals) | 3.21 |
| Sartomer SR-399 monomer (from Sartomer) | 20.0 |
| Irgacure 907 initiator (from Ciba-Geigy) | 1.60 |
| Isopropyl thioxanthone (Sensitizer) | 0.80 |
| Methoxyether hydroquinone (Antioxidant) | 0.04 |
| Irganox 1035 antioxidant (from Ciba Geigy) | 0.04 |
| Microlith Blue 4G-K pigment dispersion (from Ciba Geigy) | 0.32 |
| Leuco crystal violet (Exposure indicator) | 0.32 |
| Pluronic L43 surfactant (from BASF) | 1.60 |
| Cyclohexanone | 40.0 |
| Methylethylketone | 320.0 |

The photosensitive layer coated plate was coated with an interlayer formulation IL-1 using a #5 Meyer rod to achieve a dry coverage of about 0.5 g/m$^2$, followed by drying in an oven at 70° C. for 8 min.

| Formulation IL-1 | Weight (g) |
| --- | --- |
| Rhoplex SG-10M (50% wt., polymeric latex from Rohm and Haas) | 10.0 |
| FC120 (25% wt., surfactant from 3M) | 0.04 |
| Water | 90.0 |

The interlayer coated plate was further coated with a mask layer formulation ML-1 using a #5 Meyer rod to achieve a dry coverage of about 0.6 g/m$^2$, followed by drying in an oven at 70° C. for 8 min.

The plate was exposed and hand processed as in EXAMPLE 1. The plate developed completely under 6 double rubs, with the mask layer and the non-imaging areas of the photosensitive layer being completely removed. The processed plate showed good imaging pattern, clean background, and good durability.

EXAMPLE 4

This example demonstrates on-press ink and fountain solution process of a lithographic plate comprising on a substrate an ink soluble or dispersible photosensitive layer, a fountain solution soluble or dispersible interlayer, and an ink soluble or dispersible mask layer. The plate can be processed on a wet press with ink and fountain solution.

An AC electrochemically grained, anodized, and polyvinyl phosphonic acid treated aluminum substrate was used as the plate substrate. The substrate was coated using a #6 Meyer rod with a photosensitive layer formulation PS-1 to achieve a dry coverage of about 1.1 g/m$^2$, followed by drying in an oven at 70° C. for 5 min.

The photosensitive layer coated plate was coated with an interlayer formulation IL-2 using a #5 Meyer rod to achieve a dry coverage of about 0.4 g/m$^2$, followed by drying in an oven at 70° C. for 8 min.

| Formulation IL-2 | Weight (g) |
| --- | --- |
| Airvol 603 (polyvinyl alcohol from Air Products and Chemicals Co.) | 4.0 |
| Water | 96.0 |

The interlayer coated plate was further coated with a mask layer formulation ML-2 using a #6 Meyer rod to achieve a dry coverage of about 0.5 g/m$^2$, followed by drying in an oven at 70° C. for 8 min.

| Formulation ML-2 | Weight ratios |
| --- | --- |
| Microlith Black C-K (carbon black in polymer solid dispersion from Ciba Geigy) | 2.5 |
| Cyracure UVR-6110 (a liquid epoxy compound from Union Carbide) | 1.5 |
| Epon-1031 (a solid epoxy compound from Shell Chemicals) | 1.0 |
| Methylethylketone | 95.0 |

The plate was exposed and hand processed as in EXAMPLE 1. The plate developed completely under 6 double rubs, with the mask layer and the non-imaging areas of the photosensitive layer being completely removed. The processed plate showed good imaging pattern, clean background, and good durability.

I claim:

1. A method of lithographically printing images on a receiving medium, comprising in order:
   (a) providing a lithographic plate comprising (i) a substrate; (ii) a photosensitive layer capable of hardening or solubilization upon exposure to an actinic radiation in ultraviolet and visible region, the non-hardened or solubilized areas of said photosensitive layer being soluble or dispersible in ink, and said photosensitive layer exhibiting an affinity or aversion substantially opposite to the affinity or aversion of said substrate to at least one printing liquid selected from the group consisting of ink and an abhesive fluid for ink; and (iii) an infrared laser sensitive mask layer which is substantially opaque to the actinic radiation, soluble or dispersible in ink (for waterless plate) or in ink and/or fountain solution (for wet plate), and capable of being removed or rendered transparent to the actinic radiation upon exposure to an infrared laser radiation;
   (b) imagewise exposing the plate with the infrared laser radiation to selectively remove or render transparent to the actinic radiation exposed areas of the mask layer;
   (c) overall exposing the plate with the actinic radiation to cause hardening or solubilization of the photosensitive layer in the areas wherein the mask layer has been removed or rendered transparent by the infrared laser radiation; and
   (d) on a printing press, contacting said exposed plate with ink (for waterless plate), or with ink and/or fountain solution (for wet plate) to remove the mask layer and develop the photosensitive layer, and to lithographically print images from said plate to the receiving medium.

2. The method of claim 1 wherein said plate is mounted on the same imaging drum (internal or external drum) for said imagewise exposure and said overall exposure.

3. The method of claim 1 wherein said plate is mounted on the plate cylinder of said press for said imagewise exposure and said overall exposure; and the exposed plate is rotated on the same plate cylinder to contact with ink (for waterless plate) or with ink and/or fountain solution (for wet plate) to remove the mask layer and develop the photosensitive layer and to lithographically print images from said plate to the receiving medium.

4. The method of claim 1 wherein said photosensitive layer is oleophilic, said substrate is hydrophilic, and said plate is a wet lithographic plate.

5. The method of claim 1 wherein said photosensitive layer is oleophobic, said substrate is oleophilic, and said plate is a waterless lithographic plate.

6. The method of claim 1 wherein said photosensitive layer is negative-working and comprises an oleophilic polymeric binder, a monomer or oligomer with at least one acrylate or methacrylate functional group, and a photosensitive free-radical initiator.

7. The method of claim 1 wherein said actinic radiation is an ultraviolet radiation, and said mask layer comprises an ultraviolet absorbing dye or pigment.

8. The method of claim 1 wherein said mask layer comprises an infrared light absorbing material selected from the group consisting of carbon black, dispersed metal particles, infrared light absorbing dye, and conducting polymer.

9. The method of claim 1 wherein said mask layer is removed by thermal ablation with an infrared laser radiation.

10. The method of claim 1 wherein said plate further includes an interlayer interposed between the mask layer and the photosensitive layer, said interlayer being soluble or dispersible in ink (for waterless plate) or in ink and/or fountain solution (for wet plate), and is substantially transparent to the actinic radiation.

11. The method of claim 1 wherein said plate further includes a releasable sublayer interposed between the substrate and the photosensitive layer, said releasable sublayer being soluble or dispersible in ink (for waterless plate) or in ink and/or fountain solution (for wet plate); wherein the substrate comprises rough and/or porous surface capable of mechanical interlocking with a coating deposited thereon, and the sublayer is substantially conformally coated on the microscopic surfaces of the substrate and is thin enough in thickness, to allow bonding between the photosensitive layer and the substrate through mechanical interlocking.

12. A lithographic plate comprising in order:
   (a) a substrate;
   (b) a photosensitive layer capable of hardening or solubilization upon exposure to an actinic radiation in ultraviolet and visible region, the non-hardened or solubilized areas of said photosensitive layer being soluble or dispersible in ink, and said photosensitive layer exhibiting an affinity or aversion substantially opposite to the affinity or aversion of said substrate to at least one printing liquid selected from the group consisting of ink and an abhesive fluid for ink; and
   (c) an infrared laser sensitive mask layer which is substantially opaque to the actinic radiation, soluble or dispersible in ink (for waterless plate) or in ink and/or fountain solution (for wet plate), and capable of being removed or rendered transparent to the actinic radiation upon exposure to an infrared laser radiation.

13. The lithographic plate of claim 12 wherein said substrate is hydrophilic; said photosensitive layer is oleophilic and comprises an oleophilic polymeric binder, a monomer or oligomer with at least one acrylate or methacrylate functional group, and a photosensitive free-radical initiator; and said mask layer is capable of being removed by thermal ablation with an infrared laser radiation.

14. The lithographic plate of claim 12 further including an interlayer interposed between the mask layer and the photosensitive layer, said interlayer being soluble or dispersible in ink (for waterless plate) or in ink and/or fountain solution (for wet plate), and is substantially transparent to the actinic radiation.

15. A method of lithographically printing images on a receiving medium, comprising in order:
   (a) providing a lithographic plate comprising (i) a substrate; (ii) a photosensitive layer capable of hardening or solubilization upon exposure to an actinic radiation in ultraviolet and visible region, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an abhesive fluid for ink; (iii) an interlayer which is soluble or dispersible in ink, and (iv) an infrared laser sensitive mask layer, said mask layer being substantially opaque to the actinic radiation, soluble or dispersible in ink (for waterless plate) or in ink and/or fountain solution (for wet plate), and capable of being removed or rendered transparent to the actinic radiation upon exposure to an infrared laser radiation;
   (b) imagewise exposing the plate with the infrared laser radiation to selectively remove or render transparent to the actinic radiation exposed areas of the mask layer;

(c) overall exposing the plate with the actinic radiation to cause hardening or solubilization of the photosensitive layer in the areas wherein the mask layer has been removed or rendered transparent by the infrared laser radiation; and (d) on a printing press, contacting said exposed plate with ink (for waterless plate), or with ink and/or fountain solution (for wet plate) to remove the mask layer and develop the photosensitive layer, and to lithographically print images from said plate to the receiving medium.

16. The method of claim 15 wherein said plate is mounted on the plate cylinder of said press for said imagewise exposure and said overall exposure; and the exposed plate is rotated on the same plate cylinder to contact with ink (for waterless plate) or with ink and/or fountain solution (for wet plate) to remove the mask layer and develop the photosensitive layer and to lithographically print images from said plate to the receiving medium.

17. The method of claim 15 wherein said interlayer comprises an ink soluble polymer.

18. The method of claim 15 wherein said plate is mounted on the same imaging drum (internal or external drum) for said imagewise exposure and said overall exposure.

19. The method of claim 1 wherein said plate is mounted on the same imaging drum (internal or external drum) for said imagewise exposure and said overall exposure.

20. A method of lithographically printing images on a receiving medium, comprising in order:

(a) providing a lithographic plate comprising (i) a substrate; (ii) a photosensitive layer capable of hardening or solubilization upon exposure to an actinic radiation in ultraviolet and visible region, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an abhesive fluid for ink; and (iii) an infrared laser sensitive mask layer, said mask layer being substantially opaque to the actinic radiation, soluble or dispersible in ink, and capable of being removed or rendered transparent to the actinic radiation upon exposure to an infrared laser radiation;

(b) imagewise exposing the plate with the infrared laser radiation to selectively remove or render transparent to the actinic radiation exposed areas of the mask layer;

(c) overall exposing the plate with the actinic radiation to cause hardening or solubilization of the photosensitive layer in the areas wherein the mask layer has been removed or rendered transparent by the infrared laser radiation; and (d) on a printing press, contacting said exposed plate with ink (for waterless plate), or with ink and/or fountain solution (for wet plate) to remove the mask layer and develop the photosensitive layer, and to lithographically print images from said plate to the receiving medium.

21. The method of claim 20 wherein said plate is mounted on the plate cylinder of said press for said imagewise exposure and said overall exposure; and the exposed plate is rotated on the same plate cylinder to contact with ink (for waterless plate) or with ink and/or fountain solution (for wet plate) to remove the mask layer and develop the photosensitive layer and to lithographically print images from said plate to the receiving medium.

22. The method of claim 20 wherein said mask layer comprises an infrared light absorbing dye or pigment dissolved or dispersed in an ink soluble polymer.

23. The method of claim 20 wherein said photosensitive layer is oleophilic, said substrate is hydrophilic, and said plate is a wet lithographic plate.

24. The method of claim 20 wherein said photosensitive layer is oleophobic, said substrate is oleophilic, and said plate is a waterless lithographic plate.

25. The method of claim 20 wherein said photosensitive layer is negative-working and comprises an oleophilic polymeric binder, a monomer or oligomer with at least one acrylate or methacrylate functional group, and a photosensitive free-radical initiator.

26. The method of claim 20 wherein said actinic radiation is an ultraviolet radiation, and said mask layer comprises an ultraviolet absorbing dye or pigment.

27. The method of claim 20 wherein said mask layer comprises an infrared light absorbing material selected from the group consisting of carbon black, dispersed metal particles, infrared light absorbing dye, and conducting polymer.

28. The method of claim 20 wherein said mask layer is removed by thermal ablation with an infrared laser radiation.

29. The method of claim 20 wherein said plate further includes an interlayer interposed between the mask layer and the photosensitive layer, said interlayer being soluble or dispersible in ink (for waterless plate) or in ink and/or fountain solution (for wet plate), and is substantially transparent to the actinic radiation.

30. The method of claim 20 wherein said plate further includes a releasable sublayer interposed between the substrate and the photosensitive layer, said releasable sublayer being soluble or dispersible in ink (for waterless plate) or in ink and/or fountain solution (for wet plate); wherein the substrate comprises rough and/or porous surface capable of mechanical interlocking with a coating deposited thereon, and the sublayer is substantially conformally coated on the microscopic surfaces of the substrate and is thin enough in thickness, to allow bonding between the photosensitive layer and the substrate through mechanical interlocking.

* * * * *